US010499530B2

United States Patent
Frink et al.

(10) Patent No.: US 10,499,530 B2
(45) Date of Patent: Dec. 3, 2019

(54) SERVER SYSTEM (71) Applicant: Amazon Technologies, Inc., Seattle, WA (US)

(72) Inventors: Darin Lee Frink, Lake Tapps, WA (US); Roey Rivnay, Seattle, WA (US); Christopher Strickland Beall, Woodinville, WA (US); Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 205 days.

(21) Appl. No.: 15/058,103

(22) Filed: Mar. 1, 2016

(65) Prior Publication Data
US 2017/0257972 A1 Sep. 7, 2017

(51) Int. Cl.
H05K 7/14 (2006.01)
G06F 1/18 (2006.01)
G11B 33/12 (2006.01)

(52) U.S. Cl.
CPC ........... *H05K 7/1492* (2013.01); *G06F 1/187* (2013.01); *G11B 33/128* (2013.01); *H05K 7/1485* (2013.01)

(58) Field of Classification Search
CPC .. H05K 7/1485; H05K 7/1487; H05K 7/1488; H05K 7/1489; H05K 7/1492; H05K 7/1494
See application file for complete search history.

(56) References Cited

U.S. PATENT DOCUMENTS

| 9,317,078 | B2* | 4/2016 | Lam ........................ G06F 1/187 |
| 2001/0049210 | A1* | 12/2001 | Pinteric ................ G11B 33/122 439/76.1 |
| 2006/0132964 | A1* | 6/2006 | Lau ........................ G11B 25/10 360/92.1 |
| 2010/0118483 | A1* | 5/2010 | Kurokawa .............. G06F 1/187 361/679.33 |
| 2011/0007464 | A1* | 1/2011 | Leigh ................... H01R 9/2408 361/679.01 |
| 2011/0289327 | A1* | 11/2011 | Nolterieke ................ G06F 1/26 713/300 |
| 2012/0116590 | A1 | 5/2012 | Florez-Larrahondo et al. |

(Continued)

OTHER PUBLICATIONS

U.S. Appl. No. 14/217,149, filed Mar. 17, 2014, David Edward Bryan.

(Continued)

*Primary Examiner* — Hoa C Nguyen
*Assistant Examiner* — Christopher L Augustin
(74) *Attorney, Agent, or Firm* — Robert C. Kowert; Myertons, Hood. Kivlin, Kowert & Goetzel, P.C.

(57) ABSTRACT

A system includes a rack and one or more server systems mounted in the rack. A server system includes a chassis with one or more arrays of devices in the chassis. Each array includes mass storage devices and a server device mounted in the array within the chassis of the server system. The server device occupies no more than an equivalent volume of space in the chassis as one of the mass storage devices. A set of mass storage devices of an array and the server device of the array form a logical node, and a server system may include multiple logical nodes in the same chassis. Each array of devices may be located in a sled that can move into and out of the chassis of the server system.

19 Claims, 7 Drawing Sheets

(56) References Cited

U.S. PATENT DOCUMENTS

2015/0181748 A1    6/2015  Bailey et al.
2016/0095246 A1*  3/2016  Noland ................ H05K 7/1489
                                                               361/679.31
2016/0205804 A1*  7/2016  Hartman ............ H05K 7/20836
                                                               361/679.31

OTHER PUBLICATIONS

U.S. Appl. No. 14/217,124, filed Mar. 17, 2014, David Edward Bryan.
U.S. Appl. No. 14/217,121, filed Mar. 17, 2014, David Edward Bryan.
U.S. Appl. No. 15/087,746, filed Mar. 31, 2016, Roey Rivnay, et al.
International Search Report and Written Opinion from PCT/US2017/020072, dated Jun. 26, 2017, Amazon Technologies, Inc., pp. 1-11.

* cited by examiner

SERVER SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components, such components include printed circuit boards, mass storage devices, power supplies, and processors. Some known computer systems include a plurality of large, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some computer systems are rack mounted servers that include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in a server chassis. This wasted space, especially when multiplied over many servers in a rack, may result in inadequate computing or storage capacity for a system.

Some servers that include a number of hard disk drives use a centralized controller to control accesses to the hard disk drives, such as reads and writes. In such server designs using a centralized controller, a failure of the controller or ancillary equipment associated with the controller, may cause all the hard disk drives of the server to be unreachable. Thus reducing the reliability of the server.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of computer systems, and systems and methods for performing computing operations, are disclosed. According to one embodiment, a system for storing data includes a rack and a server system coupled to the rack. The server system includes a chassis and an array of devices mounted within the chassis of the server system. The array of devices includes mass storage devices, such as hard disk drives, mounted in the array. The mass storage devices are coupled to a backplane of the array. In addition, the array includes a server device mounted in the array and coupled to the backplane of the array, wherein the server device occupies up to an equivalent volume of space in the chassis as one of the mass storage devices in the array. The server device is configured to control storage operations for the mass storage devices in the array and comprises a network port for other systems to access data stored on the mass storage devices over a network. In some embodiments, an array may include multiple backplanes communicatively coupled with each other. For example, a server system may include an array that includes hard disk drives and a server device that controls access to the hard disk drives. The server device may be mounted in the array along with the hard disk drives and occupy up to an equivalent volume of space in the chassis of the server system as one of the hard disk drives. One or more backplanes may communicatively couple the hard disk drives of the array with the server device of the array.

According to one embodiment, a server system includes a chassis and an array of devices mounted in the chassis, wherein the array includes mass storage devices and a server device. The server device is communicatively coupled to the mass storage devices of the array and is configured to control storage operations of the mass storage devices in the array. The server system also includes one or more additional arrays of devices mounted in the chassis. Each of the additional arrays includes mass storage devices mounted in the additional arrays and respective server devices mounted in each respective additional array. The respective server devices are communicatively coupled to the mass storage devices of the respective arrays and are configured to control storage operations of the mass storage devices of the respective arrays. In some embodiments, each of the arrays and additional arrays may form a separate logical node within the server system.

According to one embodiment, a method includes coupling mass storage devices in respective slots of an array of slots in a chassis of a server system, coupling a server device in a particular slot of the array of slots in the chassis of the server system, wherein the particular slot of the array occupies up to an equivalent volume of space in the chassis as other ones of the slots of the array in which the mass storage devices are coupled, wherein the server device is configured to control storage operations for the mass storage devices in the array of slots and comprises a network port for communicating with other systems.

As used herein, "backplane" means a plate or board to which other electronic components, such as mass storage devices, server devices, etc. can be mounted. In some embodiments, mass storage devices, which can include one or more hard disk drives, are plugged into a backplane in a generally perpendicular orientation relative to the face of the backplane. In some embodiments, a server device is plugged into a backplane in a generally perpendicular orientation relative to the face of the backplane. In some embodiments, a backplane includes one or more power buses that can transmit power to components on the backplane, and one or more data buses that can transmit data to and from components installed on the backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "mounting" a particular element on another element refers to positioning the particular element to be in physical contact with the other element, such that the other element provides one or more of structural support, positioning, structural load transfer, stabilization, shock absorption, some combination thereof, or the like with regard to the particular element. The mounted particular element may be positioned to rest upon one or more upper surfaces of the other element, independent of coupling the elements via one or more coupling elements. In some embodiments, mounting the particular element to another element includes coupling the elements such that the other element provides one or more of structural support, positioning, structural load transfer, stabilization, shock absorption, some combination thereof, or the like with regard to the particular element.

As used herein, a "rack" means a rack, container, frame, or other element or combination of elements that can contain or physically support one or more computer systems. In some embodiments a rack is a standard 19" rack that conforms to EIA standards.

Some servers that mount in a rack may be general purpose servers, while some rack-mounted servers may be specially designed for storage capacity. Such specially designed servers may include storage servers that include several hard disk drives and controller servers that include controllers that manage storage operations directed at the hard disk drives in the storage servers. A controller server may be mounted in a separate chassis in a separate rack slot from a rack slot in which a storage server is mounted. In such servers, some available space in the slot of the rack in which the controller server is mounted may go unutilized, thus reducing the number and density of hard disk drives that can be mounted in the rack. For example, only a portion of a space of a rack slot in which a controller server is mounted may be occupied by components of the controller server or only a portion of an interior space within a chassis of a controller server may be occupied by components of the controller server. Also, some servers that include a separate controller server may be configured such that the controller server and hard disk drives controlled by the controller server form a single logical node. In such servers, if a common component fails, such as a component in the controller server, the whole logical node including all of the hard disk drives controlled by the controller server may become inaccessible. Thus in such designs a large number of hard disk drives may be rendered unavailable due to a single component failure.

In some embodiments, wasted space in a separate controller server may be eliminated by including a server device in a same chassis of a server system along with mass storage devices, such as hard disk drives, that are controlled by the server device. Also, failure impact due to a single component failure may be reduced by including several logical nodes, each with their own server device, in the same chassis of the server system. In some embodiments, a server system may include a server device mounted in a same chassis with mass storage devices, such as hard disk drives. The server device may occupy an equivalent volume of space in the chassis as one of the mass storage devices. Thus a greater density of mass storage devices per rack may be achieved by eliminating unutilized space of a separate controller server as described above. Also, in some embodiments, multiple logical nodes each comprising its own server device and an array of mass storage device controlled by the server device may be included in a chassis of a server system. The multiple logical nodes may be independent of each other, so that if a component in one logical node fails, such as a server device of the logical node, the other logical nodes in the server system may not be affected by the failure and continue to be available to perform storage operations.

A chassis of a server system may be a single enclosure that is configured to mount in a rack. For example, mass storage devices and server devices mounted in a chassis of a server system may be installed in a rack as a single whole system or device that occupies a slot in the rack. In some embodiments, a height of a server system may span multiple 1 Us in a standard 19" EAI rack. For example, a server system may have a height of 1 U, 2 U, 3 U, 4 U, 5 U, 1.5 U, 2.5 U, etc.

Figure 1:
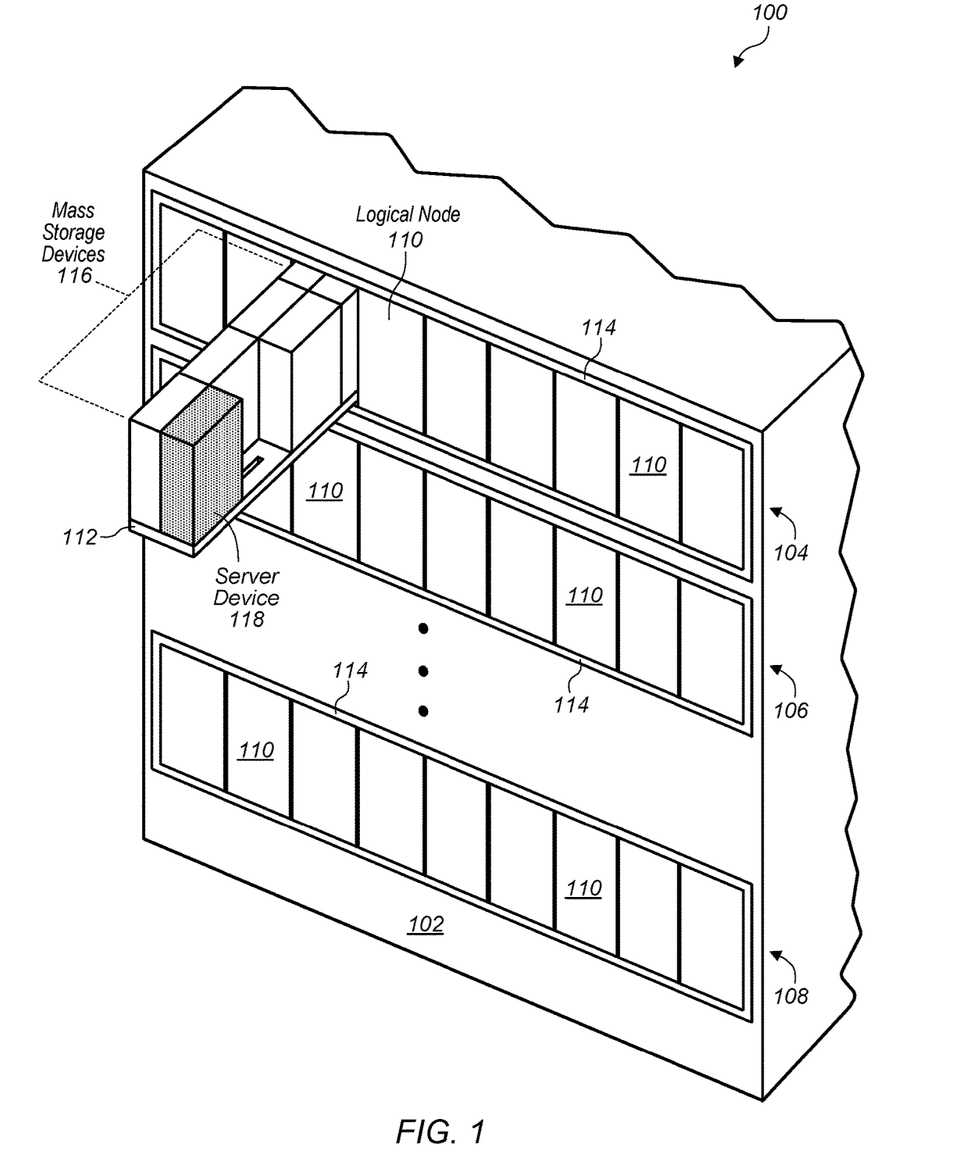
FIG. 1 is a perspective view illustrating a rack comprising multiple server systems, according to some embodiments.

FIG. 1 is a perspective view illustrating a rack comprising multiple server systems, according to some embodiments. System 100 includes rack 102 and server systems 104, 106, and 108 mounted in rack 102. Each of server systems 104, 106, and 108 include multiple arrays of device slots with mass storage devices and a server device mounted in respective device slot of respective ones of the arrays. Each array of mass storage devices and a respective server device forms a separate logical node of multiple logical nodes of the server systems. For example, server system 104 includes 9 logical nodes 110, wherein each logical node includes an array of mass storage devices and a server device for controlling storage operations directed at the array of mass storage devices. In some embodiments, each logical node of a server system includes mass storage devices and a server device mounted in device slots of a sled, wherein the sled is configured to move into and out of a chassis of the server system independently of other components of the server system, such as other sleds comprising other logical nodes. FIG. 1 illustrates sled 112 partially extended out of chassis 114 of server system 104. Mass storage devices 116 and server device 118 are mounted in device slots of an array of device slots of sled 112. Each of logical nodes 110 may include a separate array of device slots with mass storage devices and a server device mounted in the array of device slots as shown in sled 112. In some embodiments, a server device, such as server device 118, occupies up to an equivalent volume of space within chassis 114 as one of the mass storage devices of the server system, such as one of mass storage devices 116. In some embodiments, a server device, such as server device 118, may have a form factor that is equivalent to a form factor of a mass storage device, such as one of mass storage devices 116. In some embodiments, a server device, such as server device 118, may have a form factor that is smaller than a form factor of a mass storage device, such as one of mass storage devices 116. For example, server device 118 may have a form factor such that server device 118 can fit within a space that has a volume equivalent to a volume of a mass storage device, such as one of mass storage devices 116.

A server device, such as server device 118, may include one or more network ports and be configured to communicate with systems outside of server system 100. For example, server device 118 may be configured to receive read and write requests from other computing systems and/or servers to read data from and write data to mass storage devices 116.

In some embodiments, an array of devices in a server system that forms its own logical node, such as one of logical nodes 110 in server system 104, may include more than one server device in the logical node. For example, a logical node, such as one of logical nodes 110, may include multiple server devices in the same array of devices that forms the logical node. The multiple server devices of a logical node may be configured to coordinate with each other to control storage operations related to mass storage devices of the logical node, such as mass storage devices 116. In some embodiments, a ratio of server devices to mass storage devices may be adjusted by adding or removing mass storage devices and/or server devices from an array of devices that forms the logical node.

In some embodiments, server devices of a logical node may perform compute operations in addition to managing storage operations related to an array of mass storage devices of the logical node. In some embodiments, multiple server devices may be included in a single logical node to provide additional computing capacity for the logical node.

In some embodiments, mass storage devices and/or a server device of a logical node are configured to be removed from the logical node while other logical nodes of the server system are in operation. For example, a mass storage device has been removed from a device slot of sled 112. In some embodiments, mass storage devices of a logical node may be hot pluggable, such that a mass storage device can be removed from a logical node while other mass storage devices of the logical node remain available to perform storage operations and the server device of the logical node remains in operation. For example, mass storage devices 116 and server device 118 of sled 112 may perform storage operations while sled 112 is partially removed from server system 104 and while a mass storage device is removed from one of the device slots of sled 112. Also, in some embodiments, a server device, such as server device 118 may be removed from a device slot of a server system, while other logical nodes, such as other ones of logical nodes 110 remain in operation. For example, server device 118 may be removed from a device slot of sled 112 while other ones of logical nodes 110 of server system 104 remain in operation.

In some embodiments, data storage operations for mass storage devices of a logical node, such as one of logical nodes 110, may be controlled by a server device included in the logical node in an array of devices slots of the logical node along with a mass storage devices of the logical node mounted in the array of device slots without using an additional controller. The mass storage devices of a logical node may be controlled without an external controller controlling storage operations of the mass storage devices of the logical node. For example each of logical nodes 110 may include their own server device and not rely on an external controller mounted in another rack slot in rack 102 to control data operations of mass storage devices in respective ones of logical nodes 110.

By including server devices in an array with mass storage devices in a single chassis, a high density of mass storage devices in a rack can be achieved. For example, in some embodiments, a 48 U standard 19" rack may include over 1,440 3.5" hard disk drives along with server devices for controlling the hard disk drives, wherein the hard disk drives are mounted in device slots of multiple arrays included in multiple server systems mounted in the rack and wherein each array includes a server device mounted in a device slot of the respective array. In some embodiments, a 48 U standard 19" rack may include more or less hard disk drives mounted in device slots of multiple arrays. In some embodiments, other rack sizes may be used.

In some embodiments, a server system may include arrays of device slots that run from a front side of the server system to a back side of the server system. For example, FIGS. 2A-2C illustrate an embodiment of a server system with multiple arrays of device slots with mass storage devices and respective server devices mounted in the respective arrays, wherein the arrays run from a front side of the server system to a back side of the server system.

Figure 2A:
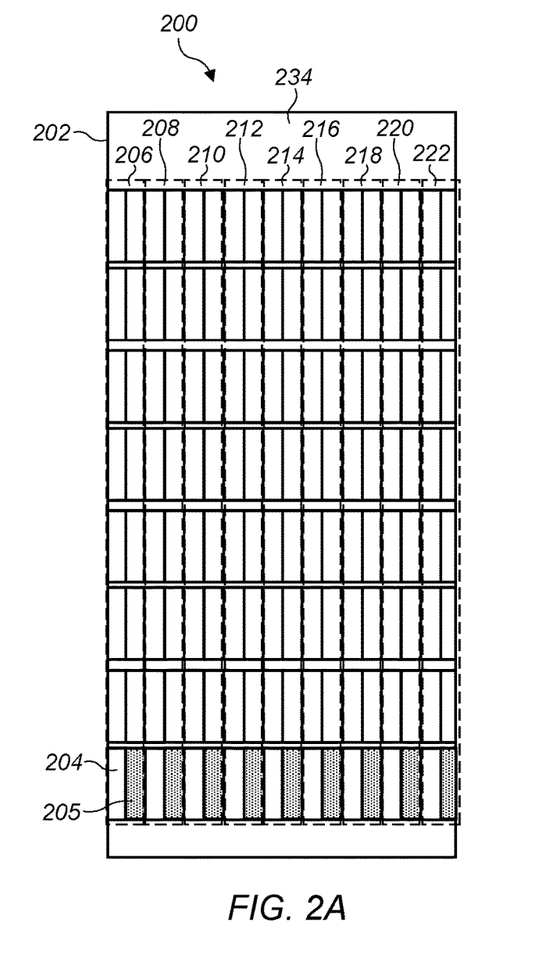
FIG. 2A is a top view of an interior of a server system, according to some embodiments.

FIG. 2A is a top view of an interior of a server system, according to some embodiments. Server system 200 includes chassis 202, mass storage devices 204 and server devices 205. Mass storage devices 204 and server devices 205 are mounted in device slots of arrays 206, 208, 210, 212, 214, 216, 218, 220, and 222. Each of arrays 206, 208, 210, 212, 214, 216, 218, 220, and 222 includes its own server device 205 and forms a separate logical node of server system 200. In some embodiments, each of arrays 206, 208, 210, 212, 214, 216, 218, 220, and 222 include a separate sled that is configured to move into and out of chassis 202 independently from one another. In some embodiments, a server system, such as server system 200, may include 9 arrays of device slots with 16 device slots in each array. In some embodiments, a server system, such as server system 200 may have a height of 4 U or 5 U. In some embodiments, a server system may have different heights and may include more or less device slots in a chassis or more or less arrays.

In some embodiments, a backplane may communicatively couple mass storage devices of a logical node with a server device of the logical node. In some embodiments, cables may be used to communicatively couple mass storage devices of a logical node with a respective server device of the logical node without using a backplane. In some embodiments, both a backplane and cables may be used to communicatively couple mass storage devices of a logical node with a respective server device of the logical node.

Figure 2B:
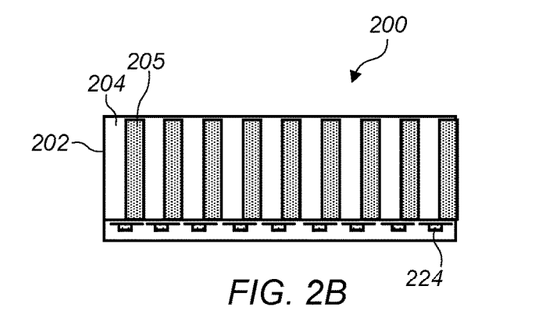
FIG. 2B is a front view of an interior of a server system, according to some embodiments.
Figure 2C:
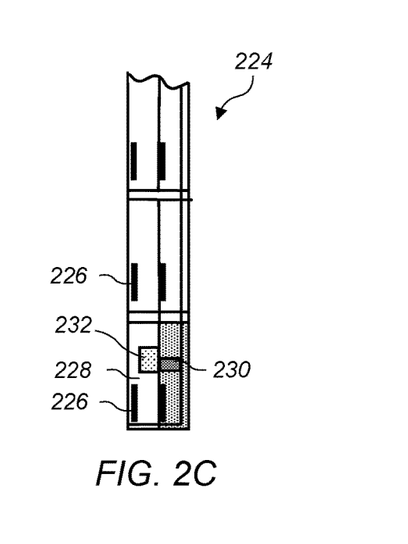
FIG. 2C is a top view of a portion of a backplane of a server system, according to some embodiments.

FIG. 2B is a front view of an interior of a server system, according to some embodiments. FIG. 2B illustrates backplanes 224 mounted beneath mass storage devices 204 and server devices 205 of arrays 206, 208, 210, 212, 214, 216, 218, 220, and 222 in a space between chassis 202 and mass storage devices 204 and server devices 205.

In some embodiments, mass storage devices and a respective server device of an array of a server system may be coupled together via a backplane. In some embodiments, a backplane of an array may be mounted beneath mass storage devices and a server device of the array in a space between a bottom of the chassis and the bottom of the mass storage devices and server device. In some embodiments, a backplane may transmit data between components coupled to the backplane, such as mass storage devices and a server device. A backplane may include a data connection that couples with a server device, such as one of server devices 205. In some embodiments a server device, such as one of server devices 205 may be connected to a backplane via a connector that is similar to a connector used to connect mass storage devices to the backplane and in some embodiments, a separate data connection may be used to couple a backplane with a storage server via a cable. In some embodiments a connector used to connect mass storage devices to a backplane may be configured to accept both mass storage devices and server devices such that mass storage device and server devices can be interchangeably coupled to a backplane via the same connector. In some embodiments a connector for coupling a mass storage device and/or a connector for coupling a server device to a backplane may comprise one or more keys or other particular configurations that prevent server devices and mass storage devices from being interchangeably coupled to the same connector.

FIG. 2C is a top view of a portion of a backplane of a server system, according to some embodiments. Backplane 224 may be the same backplane 224 illustrated in FIG. 2B. Backplane 224 includes connectors 226 mounted on circuit board 228. In some embodiments, ones of connectors 226 may be configured to only couple with mass storage devices or may be configured to only couple with server devices. In other embodiments, ones of connectors 226 may be configured to interchangeably couple with mass storage devices and server devices, such as mass storage devices 204 and server devices 205. Backplane 224 also includes power connection 230 and data connection 232. Power connection 230 may be configured to couple to a power source that provides power to server system 200 and data connection 232 may couple with a server device, such as one of server devices 205. A server device, such as server device 205, may in turn be coupled to a larger network such as a rack level network, data center network, or other network. For example, data operations from clients of a server system 200 may be directed at server devices 205 of server system 200 and data received and provided by server system 200 may be received from or provided to clients of server system 200 via server devices 205 and data connections 232. In some embodiments, a backplane may include a data connection configured to couple the backplane to a larger network such as a rack level network, data center network, or other network. In some embodiments, power may be distributed from power connection 230 via circuit board 228 to components coupled to backplane 224 such as mass storage devices 204 and a server device 205. In some embodiments, a server system, such as server system 200 may not include a backplane 224 and may include cables to distribute power to mass storage devices 204 and a server device 205. In some embodiments, cables may transmit data between mass storage devices 204, a server device 205, and clients of the server system. In some embodiments both cables and a backplane may be used to distribute power and transmit data within a server system 200.

In some embodiments, components of a server system, such as server system 200, may be cooled by air moving devices such as fans. For example in some embodiments, fans may be mounted in space 234 in chassis 202 of server system 200 to direct air to flow over mass storage devices 204 and server devices 205. In some embodiments, a server system, such as server system 200, may be liquid cooled. For example, server system 200 may include pipes, tubes, or other suitable means to convey a liquid coolant to mass storage devices 204 and server devices 205 to remove waste heat from mass storage devices 204 and server devices 205. In some embodiments, a server system, such as server system 200, may be cooled by an external cooling system, such as a rack level cooling system. In some embodiments, other suitable means may be used to remove waste heat from mass storage devices and server devices of a server system.

Figure 3:
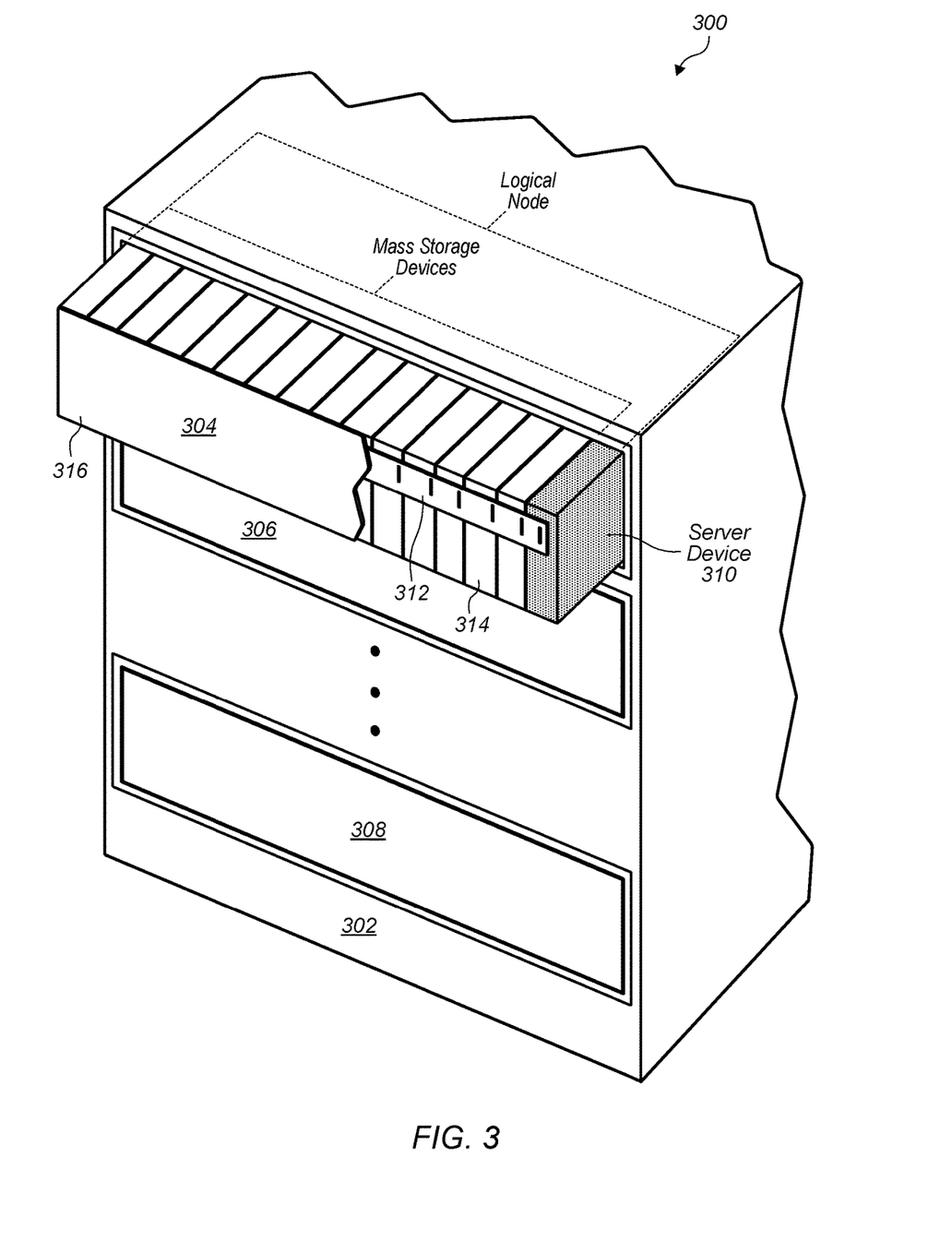
FIG. 3 is a perspective view illustrating a rack comprising multiple server systems, according to some embodiments.

The arrangement of mass storage devices and server devices illustrated in FIGS. 1-2 is an example of a server system with mass storage devices and server devices mounted in arrays in a common chassis. However, in some embodiments, mass storage devices and server devices may be arranged in other arrangements in a server system. For example, in some embodiments, mass storage devices and respective server devices may be arranged in arrays that span a width of a server system, for example from a left side of the server system to a right side of the server system when the server system is mounted in a rack. For example, FIG. 3 is a perspective view illustrating a rack comprising multiple server systems, according to some embodiments. System 300 includes rack 302 and server systems 304, 306, and 308. Server system 304 includes chassis 316, mass storage devices 314, server device 310, and backplane(s) 312. Mass storage devices 314 and server device 310 are mounted in an array of device slots in chassis 316 that spans a width of rack 302, e.g. from a left side of rack 302 to a right side of rack 302. Rack 302 is illustrated with ellipses between server system 306 and server system 308 to indicate that a rack, such as rack 302, may include more or less server systems. In some embodiments, rack 302 may be a 48 U rack and each server system may have a height that occupies 3 Us of rack 302. In some embodiments, a server system may have different heights. For ease of illustration, server system 304 is shown partially removed from rack 302. In some embodiments, a server system, such as server system 304, may include multiple arrays of mass storage devices and respective server devices that span a width of the server system. For example, in some embodiments, server system 304 may include 6 arrays of server systems. Also, for ease of illustration, only server system 304 is shown partially removed from rack 302. However, in some embodiments, server systems 306 and 308 may include similar components in a similar arrangement as shown for server system 304.

Figure 4A:
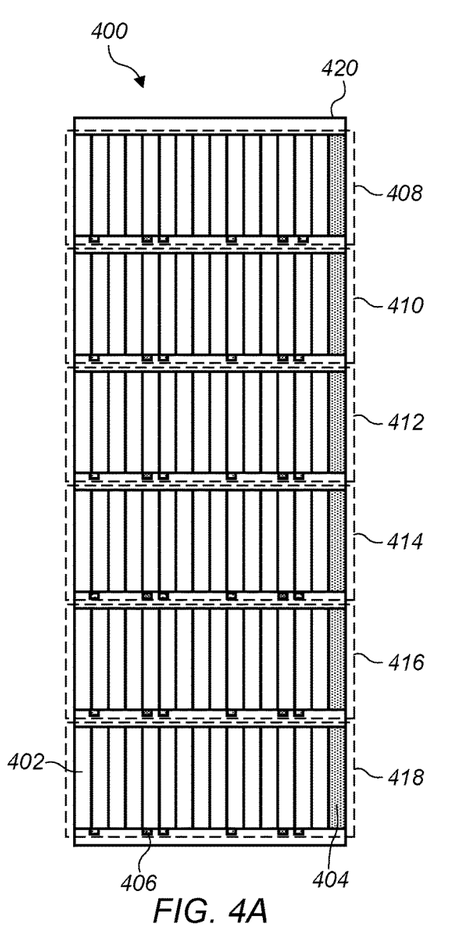
FIG. 4A is a top view of an interior of a server system, according to some embodiments.
Figure 4B:
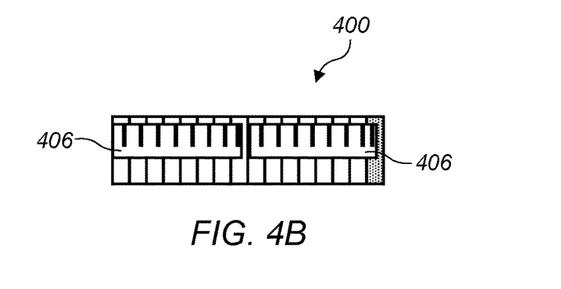
FIG. 4B is a front view of an interior of a server system, according to some embodiments.
Figure 4C:
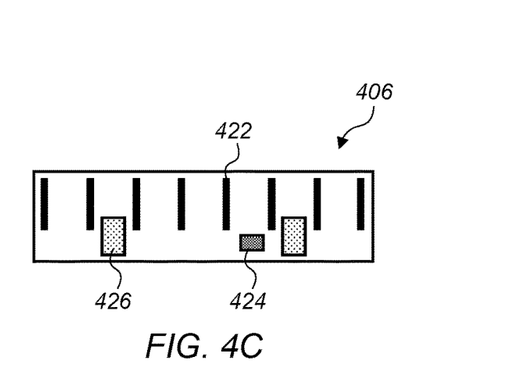
FIG. 4C is a front view of a backplane of a server system, according to some embodiments.

FIGS. 4A-C illustrate different views of a server system with arrays of mass storage devices and server devices arranged in horizontal arrays, according to some embodiments. Any of server systems 304, 306, and 308 may include similar components in a similar arrangement as illustrated in FIGS. 4A-C.

FIG. 4A is a top view of an interior of a server system, such as one of server systems 304, 306, or 308, according to some embodiments. Server system 400 includes mass storage device 402, server devices 404, and backplanes 406. In server system 400, groups of mass storage devices 402, respective ones of server devices 404 and respective backplanes 406 are organized in multiple arrays that each form a logical node within server system 400. For example server system 400 includes arrays 408, 410, 412, 414, 416, and 418. Each of arrays 408, 410, 412, 414, 416, and 418 includes a group of mass storage devices 402 and a respective server device 404 that coordinates data storage operations of the mass storage devices 402 in the respective array. Because each array it its own logical node, a failure of a component, such as a server device in one array does not prevent other arrays or logical nodes within server system 400 from continuing to perform storage operations.

In FIG. 4A, a backplane 406 is illustrated as being coupled to each one of arrays 408, 410, 412, 414, 416, and 418. In some embodiments, a single back plane may be coupled to multiple arrays. For example, a backplane may be mounted between successive arrays in a chassis of a server system and mass storage devices and server devices may be coupled to two sides of the backplane. For example a backplane between arrays 416 and 418 may be coupled to mass storage devices 402 and server device 404 of array 418 on a first side of the backplane and may be coupled to mass storage devices 402 and server device 404 of array 416 on a second side of the backplane. In some embodiments, mass storage devices and server devices of respective arrays may be coupled together via cables without using a backplane. In some embodiments, both cables and backplanes may be used to couple together mass storage devices and server devices. For example, server device 404 may include multiple ports, a first port may be coupled via a cable to a first backplane that is coupled with a portion of mass storage devices 402 in array 418 and server device 404 may be coupled via another cable to another backplane that is coupled to another portion of mass storage devices 402 in array 418. In some embodiments, other suitable means may be used to couple mass storage devices with a server device that coordinates storage operations associated with the mass storage devices.

FIG. 4B is a front view of an interior of a server system, according to some embodiments. FIG. 4B illustrates a front view of an interior of server system 400 and backplane 406 coupled to mass storage devices 402 and server device 404. As shown in FIG. 4B, in some embodiments multiple backplanes 406 may be coupled to mass storage devices and a server device. FIG. 4C is a front view of a backplane of a server system, according to some embodiments. FIG. 4C illustrates one of backplanes 406. A backplane may include multiple connectors, such as connectors 422. A backplane may also include power connectors, such as power connector 424, and data connectors, such as data connectors 426. In some embodiments, a server system may be connected to a larger network via a server device, such as one of server devices 404. The server device may in turn be connected to mass storage devices, such as mass storage devices 402 via cables connected to data connectors 426. In some embodiments, connectors of a backplane, such as connectors 422 may couple to mass storage devices and one of the connectors may couple with a server device, such as server device 404. In some embodiments, a server device, such as server device 404, may be coupled to a backplane, such as backplane 406 via a cable connector, such as one of data connectors 426. Another data connector of a backplane, such as another one of data connectors 426, may couple the backplane with an additional backplane.

In some embodiments, components of a server system, such as server system 400, may be cooled by air moving devices such as fans. For example in some embodiments, fans may be mounted in or couple with chassis 420 of server system 400 to direct air to flow over mass storage devices 402 and server devices 404. In some embodiments, a server system, such as server system 400, may be liquid cooled. For example, server system 400 may include pipes, tubes, or other suitable means to convey a liquid coolant to mass storage devices 402 and server devices 404 to remove waste heat from mass storage devices 402 and server devices 404. In some embodiments, a server system, such as server system 400, may be cooled by an external cooling system, such as a rack level cooling system. In some embodiments, other suitable means may be used to remove waste heat from mass storage devices and server devices of a server system.

Figure 5:
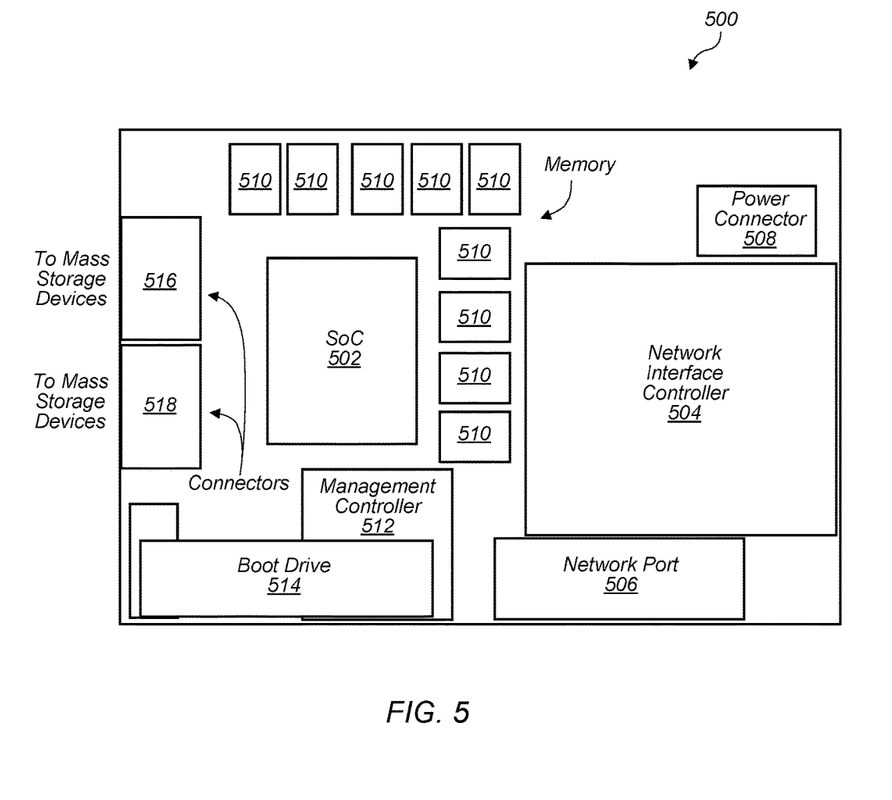
FIG. 5 illustrates a server device that occupies up to an equivalent volume of space as a mass storage device, according to some embodiments.

FIG. 5 illustrates a server device that occupies an equivalent volume of space as a mass storage device, according to some embodiments. Server device 500 illustrated in FIG. 5 may be any of the server devices described in FIGS. 1-4. In some embodiments, server device 500 may have a form factor that occupies up to an equivalent volume of space as a mass storage device, such as a 3.5" hard disk drive.

Server device 500 includes system on a chip 502, memory devices 510, power connector 508, network interface controller 504, network port 506, management and control circuit 512, boot drive 514, and connectors 516 and 518. System on a chip 502 comprises a processor and interface for communicating with mass storage devices via connectors 516 and 518. System on a chip 502 also comprises a communication interface with memory 510. In some embodiments system on a chip 502 may be an SoC, a general purpose processor, an application specific integrated circuit (ASIC), or another device that provides processing capability and communicates with connectors 516 and 518. In some embodiments, management and control circuit 512 manages conditions of server device 500 such as temperature conditions. In some embodiments, management and control circuit 512 includes an interface for connecting with an external heath monitoring system, such as an intelligent platform management interface (IPMI). In some embodiments, memory devices 510 are RAM devices such as double data rate fourth generation synchronous dynamic random-access memory (DDR4) or other suitable RAM devices. In some embodiments, network port 506 is a small form factor pluggable 10 gigabit port or other suitable port for network connection. In some embodiments, power connector 508 may be configured to receive electrical power via a cable connection, and in some embodiments, power connector 508 may be configured to couple with a backplane and receive electrical power via the backplane. In some embodiments, boot drive 514 is a solid state drive that stores program instructions for booting server device 500. In some embodiments, boot instructions for server device 500 may be stored in a remote location and boot drive 514 may be omitted. In some embodiments connectors 516 and 518 are mini SAS HD connectors. In some embodiments connectors 516 may include two mini SAS HD connectors with four lanes each and connectors 518 may include two mini SAS HD connectors with four lanes each. Thus connectors 516 and 518 may collectively include 16 lanes for connecting with 16 mass storage devices. In some embodiments, other suitable connectors may be used for connectors 516 and 518. In some embodiments, communication via connectors 516 and 518 may be in accordance with a FibreChannel standard, Serial ATA standard, or other suitable standard. In some embodiments, a backplane may couple with connectors 516 and 518 to directly couple server device 500 with mass storage devices via a backplane without using expanders or host bus adapters to connect server device 500 to mass storage devices.

In some embodiments, a server device, such as server device 500 may be mounted in a device slot of an array of device slots with connectors 516 and 518 oriented down towards a bottom of the device slot and coupled with a backplane that runs beneath mass storage devices of the array and the server device mounted in the device slot. In some embodiments, a server device, such as server device 500 may be mounted in a device slot with connectors 516 and 518 oriented parallel to the device slot. A backplane may be positioned between successive arrays of mass storage devices and server devices so that connectors 516 and 518 couple with the backplane that is positioned between successive arrays of mass storage devices and server devices. In some embodiments, a server device, such as server device 500 may be coupled to backplanes via cables connected to connectors 516 and 518.

In some embodiments, a server device such as server device 500 may be integrated into a backplane. For example the respective components of server device 500 described above may be mounted on a circuit board of a backplane. In some embodiments, a server device, such as server device 500 may be liquid cooled.

In some embodiments, a server device, such as server device 500, may have a form factor that is equivalent to a form factor of a standard 3.5" hard disk drive. In some embodiments a server device, such as server device 500, may have a different form factor.

Figure 6:
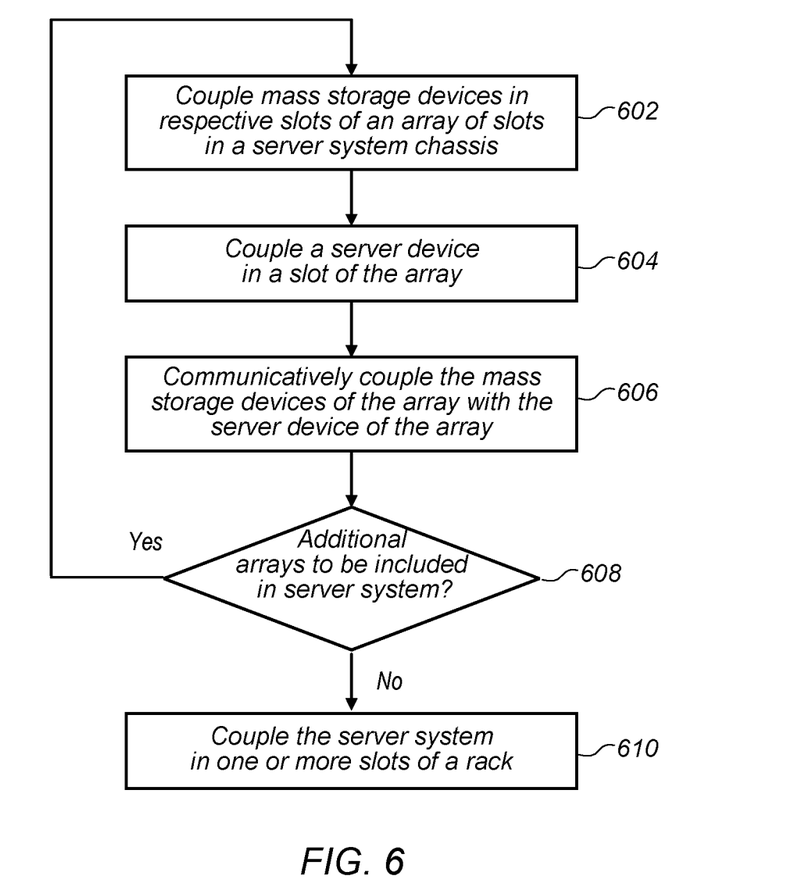
FIG. 6 illustrates installing mass storage devices and a server device in a server system, according to some embodiments.

FIG. 6 illustrates installing mass storage devices and a server device in a server system, according to some embodiments. At 602 mass storage devices are coupled in respective device slots of an array of device slots within a chassis of a server system. In some embodiments, a server system may include multiple arrays of device slots within the chassis of the server system. In some embodiments, device slots may be included in a sled of a server system and coupling mass storage devices in respective device slots of a server system may include coupling the mass storage devices into device slots of the sled of the server system.

At 604 a server device is coupled in a device slot of the array of device slots. In some embodiments a server system chassis may include multiple arrays of devices slots and a separate server device may be coupled in a device slot of each array. In some embodiments each array that includes mass storage devices and a respective server device may form its own logical node within the server system.

At 606, the mass storage devices of the array are communicatively coupled with the server device of the array. In some embodiments each array may include its own server device communicatively coupled with mass storage devices of the array. In some embodiments a server device and mass storage devices may be communicatively coupled via a backplane. In some embodiments, cables may communicatively couple a server device with mass storage devices of an array. In some embodiments, multiple backplanes and cables may be used to communicatively couple a server device with mass storage devices. In some embodiments, an array may include 16 device slots, with one of the device slots occupied by a server device and the remaining 15 device slots occupied by mass storage devices. In some embodiments, a server system may include 6, 9, or some other number of arrays of device slots in a common chassis. In some embodiments, mass storage devices of the array and a server device of the array may be communicatively coupled when the mass storage devices and the data server device are coupled in respective slots in the array. For example, 606 may be performed as part of performing 602 and 604.

As discussed at 604 and 606, in some embodiments, a server system may include multiple arrays of device slots. At 608 additional mass storage devices and additional server devices are coupled in device slots of additional arrays of device slots within a server system.

At 610, the server system is coupled in one or more slots of a rack. In some embodiments, a server system may occupy 3 U, 4 U, or 5 U of rack space in a rack. In some embodiments a server system may have different heights. In some embodiments, multiple server systems may be mounted in a rack.

Figure 7:
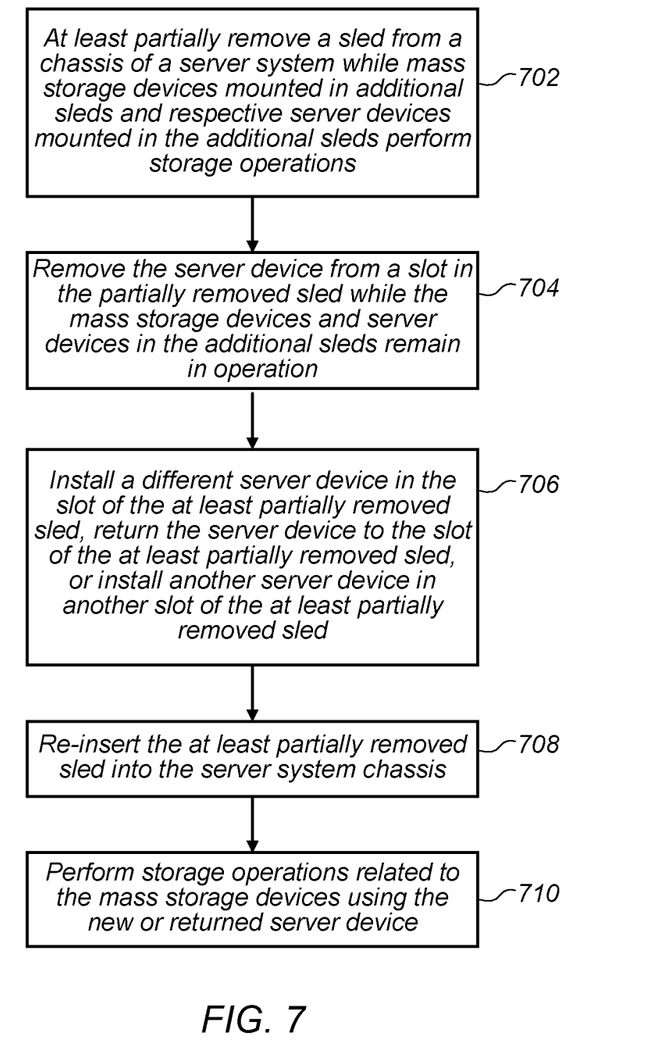
FIG. 7 illustrates removing a server device from a server system while a portion of the server system is in operation, according to some embodiments.

FIG. 7 illustrates removing a server device from a server system while a portion of the server system is in operation, according to some embodiments. At 702, a sled of a server system is at least partially removed from a chassis of the server system. In some embodiments, a server system may include multiple logical nodes in a common chassis. Each sled of a server system may comprise its own logical node, so that partially removing a sled from a server system does not affect storage operations of other logical nodes mounted in other sleds within the chassis of the server system. In some embodiments, other logical nodes may continue to perform storage operations while a particular sled comprising a particular logical node of mass storage devices and an associated server device are at least partially removed from a chassis of a server system.

At 704, a server device is removed from the sled that has been partially slid out of the chassis of the server system. In some circumstances, a mass storage device may be removed from the sled instead of the server device. In some embodiments, mass storage devices of a server system may be hot pluggable such that a mass storage device can be removed from and added to an array of device slots while remaining mass storage devices communicatively coupled with a server device associated with the array (or sled) may continue to perform data storage operations.

At 706, a different server device or the same server device is installed in the device slot from which the server device was removed. In some circumstances, it may be desirable to replace or repair a server device, for example due to a failure associated with the server device. In some embodiments, an additional server device may be installed in another slot of the sled. For example, additional compute capacity may be desired for the logical node that corresponds with the particular sled that is partially removed. In some embodiments, device slots of a sled may be configured to accept both mass storage devices and server devices, such that a mass storage device can be removed from a sled, such as the sled that is partially removed, and replaced with a server device to increase a computing capacity of a logical node corresponding to the sled.

At 708, the sled is re-inserted into the chassis of the server system. At 710 data storage operations are performed in relation to the mass storage devices mounted in the device slots of the sled using the new or returned server device.

In some embodiments, mass storage devices in a server system are standard, off-the-shelf hard disk drives. Examples of suitable hard disk drive form factors may include 3.5", 5.25", and 2.5". In one embodiment, a standard 3.5" hard disk drive is installed in a device slot of a plurality of device slots of an array along with other standard 3.5" hard disk drives. In some embodiments, a server device of an array may have a form factor equivalent to a 2.5", 3", 3.5", or 5.25" hard disk drive.

Although in the embodiments described above, some of the server systems have been described as being 3 U, 4 U, or 5 U in height, server systems may in various embodiments be 2 U, 4 U, 5 U, 6 U or any other height or dimensions.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
    a rack;
    a server system coupled to the rack, wherein the server system comprises:
        a chassis;
        an array of devices mounted within the chassis, wherein the array of devices comprises:
            mass storage devices mounted in the array and coupled to a backplane of the array; and
            a server device mounted in the array and coupled to the backplane of the array,
        wherein the server device fits in a space in the array with an equivalent form factor as one of the mass storage devices in the array, is configured to control storage operations for the mass storage devices in the array, and comprises a network port for other systems to access data stored on the mass storage devices over a network.

2. The system of claim 1, wherein the server system is coupled to the rack in a rack slot of the rack, wherein the rack does not does not include a controller for the mass storage devices of the server system in a separate rack slot of the rack.

3. The system of claim 1, wherein the server system comprises multiple arrays of devices within the chassis, wherein each respective array comprises:
    mass storage devices mounted in the respective array and coupled to a backplane of the respective array; and
    a server device mounted in the respective array and coupled to the backplane of the respective array.

4. The system of claim 3, wherein the server system further comprises:
    multiple sleds, wherein the devices of the respective arrays are mounted on respective ones of the sleds, wherein the sleds are configured to slide into and out of the chassis independently of one another.

5. A system, comprising:
    a chassis;
    an array of devices mounted in the chassis, wherein the array comprises:
        mass storage devices mounted in the array; and
        a server device mounted in the array, wherein the server device is communicatively coupled to the mass storage devices of the array and configured to control storage operations of the mass storage devices in the array; and
    additional arrays of devices mounted in the chassis, wherein each additional array comprises:
        mass storage devices mounted in the additional array; and
        a server device mounted in the additional array, wherein the server device is communicatively coupled to the mass storage devices of the additional array and configured to control storage operations of the mass storage devices in the additional array,
    wherein for one of the respective arrays, the server device fits in a space in the respective array with an equivalent form factor as one of the mass storage devices of the respective array and comprises a network port for other systems to access data stored on the mass storage devices of the respective array over a network.

6. The system of claim 5, further comprising sleds within the chassis, wherein the devices of respective ones of the arrays are mounted on respective ones of the sleds, wherein the sleds are configured to slide into and out of the chassis independently of one another.

7. The system of claim 5, wherein for each respective array, the mass storage devices of the respective array and the server device of the respective array form a separate logical node of the system.

8. The system of claim 5, wherein for one of the respective arrays, respective mass storage devices of the respective array are coupled to the server device of the respective array via a backplane.

9. The system of claim 8, wherein the backplane is mounted in the chassis between adjacent arrays of devices.

10. The system of claim 8, wherein the backplane is mounted in the chassis in a space beneath the one array and a bottom surface of the chassis.

11. The system of claim 5, wherein one of the server devices is configured to mount in a device slot that occupies a volume of space in the chassis equivalent to a volume of space occupied by a 3.5" hard disc drive.

12. The system of claim 5, wherein the mass storage devices of each respective array are directly coupled to the server device of the respective array without using an expander or host bus adapter.

13. The system of claim 5, wherein for one of the respective arrays, the respective array comprises an additional server device mounted in the respective array, wherein the additional server device is communicatively coupled to the mass storage devices of the respective array and the server device of the respective array.

14. A method comprising:
coupling mass storage devices in respective slots of an array of slots in a chassis of a server system;
coupling a server device in a particular slot of the array of slots in the chassis, wherein the particular slot of the array has an equivalent form factor in the chassis as other ones of the slots of the array in which the mass storage devices are coupled;
wherein the server device is configured to control storage operations for the mass storage devices coupled in the array of slots and the server device comprises a network port for communicating with other systems.

15. The method of claim 14, further comprising:
coupling additional mass storage devices in slots in an additional array in the chassis; and
coupling an additional server device in a slot of the additional array,
wherein the server device is configured to perform storage operations related to the mass storage devices coupled to the array as a first logical node; and the additional server device is configured to perform storage operations related to the additional mass storage devices coupled to the additional array as an additional logical node.

16. The method of claim 15, wherein coupling the mass storage devices in the slots in the array in the chassis and coupling the server device in a slot of the array in the chassis comprises coupling the mass storage devices and the server device in a sled,
wherein said coupling the additional mass storage devices in the slots of the additional array and coupling the additional server device in the slot of the additional array comprises coupling the additional mass storage devices and the additional server device in an additional sled.

17. The method of claim 16, further comprising;
at least partially removing the sled from the chassis while the additional mass storage devices and the additional server device mounted in the additional sled remain in operation in the chassis.

18. The method of claim 17, further comprising:
removing the server device from the sled while the additional server device coupled with the additional mass storage devices mounted in the additional sled continues to perform storage operations.

19. The method of claim 17, further comprising:
mounting another server device in the sled, wherein the server device mounted in the sled, the other server device mounted in the sled, and the mass storage devices mounted in the sled form a logical node of the server system.

* * * * *